(12) United States Patent
Deus et al.

(10) Patent No.: US 8,716,726 B2
(45) Date of Patent: May 6, 2014

(54) ORGANIC LIGHT EMITTING ILLUMINANT, AND DEVICE AND METHOD FOR THE PRODUCTION THEREOF

(75) Inventors: Carsten Deus, Dresden (DE); Joerk Richter, Dresden (DE); Ruben Seifert, Dresden (DE)

(73) Assignee: VON ARDENNE Anlagentechnik GmbH, Dresden (DE)

( * ) Notice: Subject to any disclaimer, the term of this patent is extended or adjusted under 35 U.S.C. 154(b) by 0 days.

(21) Appl. No.: 13/992,370

(22) PCT Filed: Dec. 7, 2011

(86) PCT No.: PCT/EP2011/072019
§ 371 (c)(1),
(2), (4) Date: Jun. 7, 2013

(87) PCT Pub. No.: WO2012/076580
PCT Pub. Date: Jun. 14, 2012

(65) Prior Publication Data
US 2013/0273678 A1    Oct. 17, 2013

(30) Foreign Application Priority Data

Dec. 7, 2010 (DE) .......................... 10 2010 062 566
May 2, 2011 (DE) .......................... 10 2011 075 081

(51) Int. Cl.
*H01L 29/20* (2006.01)

(52) U.S. Cl.
USPC ............................................. 257/89; 257/40

(58) Field of Classification Search
CPC ....... H01L 27/3211; H01L 51/56; G02B 1/10
USPC .......... 257/40, 89; 438/35; 118/500, 630, 719
See application file for complete search history.

(56) References Cited

U.S. PATENT DOCUMENTS

| | | |
|---|---|---|
| 2004/0164671 A1 | 8/2004 | Noguchi et al. |
| 2005/0196893 A1 | 9/2005 | Kim et al. |
| 2005/0239294 A1 | 10/2005 | Rosenblum et al. |

(Continued)

FOREIGN PATENT DOCUMENTS

| | | |
|---|---|---|
| EP | 1788647 B1 | 5/2007 |
| JP | 2009205929 A | 9/2009 |

(Continued)

OTHER PUBLICATIONS

International Search Report for PCT/EP2011/072019 dated Apr. 3, 2012.

(Continued)

*Primary Examiner* — Kimberly Rizkallah
*Assistant Examiner* — Duy T Nguyen
(74) *Attorney, Agent, or Firm* — Heslin Rothenberg Farley & Mesiti P.C.

(57) ABSTRACT

A coating device for producing an organic light-emitting illuminant comprising mutually adjacent regions having in each case different emission colors, includes a vacuum chamber, a device for linearly transporting a substrate, and a plurality of coating sources and diaphragms, provides OLED structures which have an improved intensity of the light emission. The thicknesses of the hole transport, emission and electron transport layers in the mutually adjacent regions differ and are in each case set such that an optimum coupling-out for the light color emitted in the corresponding region is achievable.

4 Claims, 2 Drawing Sheets

(56) References Cited

U.S. PATENT DOCUMENTS

| | | |
|---|---|---|
| 2007/0196562 A1* | 8/2007 | Ohshita et al. .................. 427/66 |
| 2007/0257609 A1* | 11/2007 | Fukuda et al. ................ 313/506 |
| 2010/0283385 A1 | 11/2010 | Maeda et al. |

FOREIGN PATENT DOCUMENTS

| | | | |
|---|---|---|---|
| JP | 2010-150640 A | 7/2010 | |
| WO | 0244629 A1 | 6/2002 | |
| WO | 2009066791 A1 | 5/2009 | |

OTHER PUBLICATIONS

National Examination Report issued for corresponding Japanese patent application No. 2013-542519 dated Nov. 25, 2013.

* cited by examiner

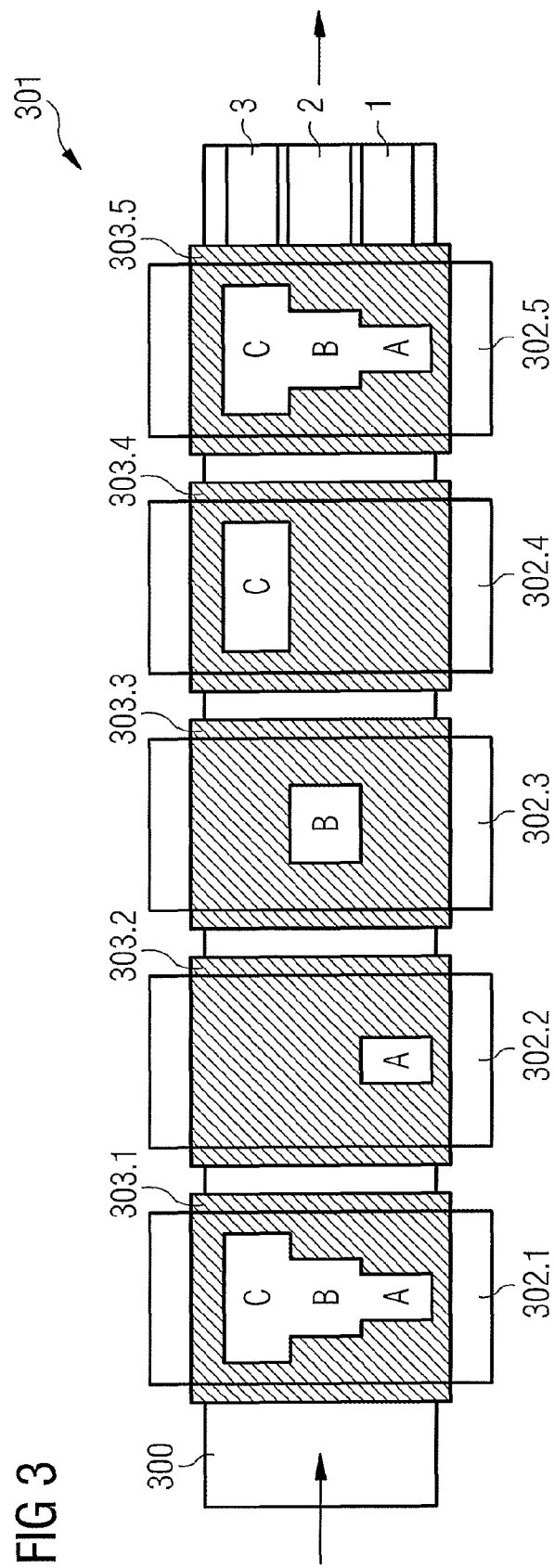

ORGANIC LIGHT EMITTING ILLUMINANT, AND DEVICE AND METHOD FOR THE PRODUCTION THEREOF

CROSS REFERENCE TO RELATED APPLICATIONS

This application is a national stage filing under section 371 of International Application No. PCT/EP2011/072019 filed on Dec. 7, 2011, and published in German on Jun. 14, 2012 as WO 2012/076580 A1 and claims priority of German patent application No. 10 2010 062 566.3 filed on Dec. 7, 2010, and German patent application No. 10 2011 075 081.9 filed on May 2, 2011, the entire disclosure of these applications being hereby incorporated herein by reference.

BACKGROUND ART

The invention relates to an organic light-emitting illuminant and to a coating device for producing it, and to a method for producing it.

Organic light-emitting illuminants, in particular organic light-emitting diodes (OLEDs), are currently already being used in many areas of consumer electronics, for example in display applications, and are also regarded as a future technology in the lighting sector. An OLED structure contains one or more light-emitting organic layers (EML) arranged between two electrodes, for example a cathode and an anode on a substrate.

According to the prior art, two designs of organic light-emitting diodes are known, depending on the direction of the light emission. It is possible to produce OLEDs having the light emission away from the substrate, in the so-called top emission geometry, or OLEDs having the light emission through the substrate, in bottom emission geometry.

Figure 1:
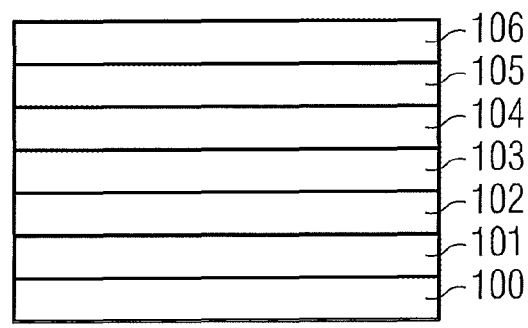

FIG. 1 indicates a schematic construction of an OLED in top emission geometry known from the prior art. It consists of a non-transparent substrate 100, on which are constructed in sequence an optional smoothing layer 101, a first electrode layer 102, which in FIG. 1 corresponds to the anode, an organic layer stack comprising a hole transport layer 103 (HTL), at least one, preferably two or three, separate, vertically constructed emission layers 104 (EML), which emit light in each case in a different color, for example red, green or blue, and comprising an electron transport layer 105 (ETL), and also a semitransparent metallic electrode layer 106, which in FIG. 1 corresponds to the cathode. Hole and electron transport layers are also referred to in combination as charge carrier transport layers. Further transparent layers, e.g. buffer layers, can optionally be present between the layers mentioned. When a voltage is applied between a first and second electrode layer, light quanta of different colors are generated in the emission layers and can leave the component through the semitransparent cathode.

In contrast to OLEDs in top emission geometry, the OLEDs in bottom emission geometry have a light-transparent substrate, on which a first light-transparent electrode layer and a second light-reflecting electrode are deposited, such that emission can take place through the substrate, i.e. in the bottom direction.

The order of the layers anode/HTL/EBL/EML/HBL/ETL/cathode, formed on the substrate, can also be reversed, in principle, in which case the electrode on the light exit side should then respectively be embodied as semitransparent or transparent.

Furthermore, OLED illuminants are known in which regions which emit light in different colors are arranged alongside one another in order to generate a white light emission. By way of example, if two mutually adjacent regions emit light in different colors, this should be understood to mean that one region emits light in a first color and the second region emits light in a second color, the first and second colors being different. By means of additive mixing of the light colors of the individual regions, a specific, for example a white, color impression can be set for the observer by means of a suitable choice of the individual colors and of the respective light intensities. In this case, each of the regions has the following layer construction containing a substrate, a first electrode, an organic layer stack and an electrode, wherein the organic layer stack has a hole transport layer, an emission layer that emits monochrome light, and an electron transport layer. The layer sequence of the organic layers corresponds to the layer construction with the anode as first electrode constructed on the substrate. A different sequence of the organic layers, which has an electron transport layer, an emission layer that emits monochrome light, and a hole transport layer corresponds to the layer construction with the cathode as first electrode. Optionally, the two variants of the layer construction can have, for each of the regions, a smoothing layer formed on the substrate.

Optionally, the OLED layer construction can also have further functional layers and layer sequences known from the prior art, for example layers that are arranged above the top electrode and are effective as a barrier to water vapor and oxygen, mechanical protective layers or optically active layers or structures that intensify the coupling-out of light.

In the top emission geometry structures, the interaction of a reflective electrode, intervening transparent layers and a semitransparent electrode results in the formation of an optical cavity and, as a result of interference effects, in a great dependence of the light intensity coupled out through the top electrode on the aggregate layer thickness of the transparent layers, such as the hole transport layer (HTL), the emission layer (EML), and electron transport layer (ETL), also called HTL, EML and ETL hereinafter. In this case, for each of the emission layers there exist optima of the aggregate layer thickness, the so-called coupling-out maxima, for which the emitted quantity of light assumes maximum values.

This effect is likewise present in the bottom emission geometry, to an attenuated extent owing to the more transparent electrode, since differences in refractive index at different boundary layers between the OLED layers and the substrate or else within the OLED layer system likewise exhibit a thickness-dependent change in the coupling-out of light.

The thickness optima for the different emission colors have different values, such that optimum light coupling-out conditions cannot be set for each of the emission colors when optimizing the layer thicknesses.

The object of the present invention is to provide OLED structures which have an improved intensity of the light emission. In this case, the intention is to increase the efficiency of coating devices for producing OLED illuminants of this type. In this case, production is intended to be cost-effectively and commercially applicable.

BRIEF SUMMARY OF INVENTION

The organic light-emitting illuminant (OLED) according to the invention is distinguished by the fact that the thicknesses of the first charge carrier transport layer, of the light-emitting emission layer and/or of the second charge carrier transport layer differ for each of the mutually adjacent regions having different emission colors and are set in each case such that an optimum coupling-out for the light color emitted in the corresponding region is achieved in each case. As a result, it is possible to obtain a maximum quantity of light for the organic light-emitting illuminant by means of the targeted setting of the thicknesses of the layers mentioned, which overall produce an aggregate layer thickness, for in each case one of the mutually adjacent regions that emit different colors. Thus, the setting of the thicknesses is not just restricted to the setting of the total thickness of the organic layer stack having the HTL, EML and ETL layers, but rather can likewise relate to the setting of the layer thicknesses of the respective layers within the respective layer stack.

In one advantageous configuration of the OLE illuminant according to the invention, each of the regions has a smoothing layer formed on the substrate. An optional smoothing layer should be understood to mean, for example, a lacquer for smoothing the substrate surface in order to avoid short circuits in and between the components in the case of rough surfaces. In a further configuration of the OLE illuminant according to the invention each of the regions has, if appropriate, at least one interposed transparent buffer layer, preferably a plurality of interposed transparent buffer layers.

According to the invention one of the electrodes is an anode, while the other electrode is a cathode. If the first electrode is the anode, the organic layer stack of the organic light-emitting illuminants according to the invention has the organic layers in the sequence of a hole transport layer, at least one emission layer and/or an electron transport layer. In the case of an organic illuminant having a cathode as first electrode, the organic layers are formed in the opposite order and have a sequence of electron transport layer, at least one emission layer and/or a hole transport layer. In general, the organic layers are light-transmissive to the light emitted from the organic layer stack.

The organic light-emitting illuminant (OLE illuminant) according to the invention emits the light generated in the organic layer stack either through its underside through the substrate. Expediently, the layers lying on the path of the light emitted by the organic layer stack are transmissive to the light being emitted.

In accordance with one advantageous embodiment of the illuminant according to the invention, with respect to the light being emitted by the organic layer stack, the first electrode is embodied as at least semitransparent, preferably transparent, and the second electrode is embodied as non-transparent. In the embodiment, the substrate is likewise embodied as transmissive, i.e. transparent, to the light being emitted by the organic layer stack. In this case, the light generated in the respective organic layer stack is emitted through the substrate. Preferably, the second electrode is embodied as reflective.

In accordance with at least one further embodiment of the illuminant according to the invention, with respect to the light being emitted by the organic layer stack, the second electrode is embodied as at least semitransparent, preferably transparent, and the first electrode is embodied as non-transparent. Preferably, the first electrode is embodied as reflective. In this case, the light generated in the respective organic layer stack is emitted through the top side of the illuminant according to the invention.

In accordance with at least one further embodiment of the illuminant, both electrodes are embodied as transmissive to the light generated by the layer stack. In this embodiment, in principle, the layers of the organic illuminant according to the invention are embodied as transmissive to the light generated by the layer stack.

In accordance with at least one embodiment, at least one of the electrodes comprises a transparent conductive oxide, a metal or a conductive organic material or consists thereof. Organic materials are generally transmissive to visible light. Therefore, an electrode which comprises organic conductive material or consists thereof is also generally transmissive to the light emitted by the organic layer stack. If the electrode which comprises the metallic layer or consists thereof is intended to be embodied as transmissive to the light emitted by the organic layer stack, then the metallic layer must be embodied in a sufficiently thin fashion.

In accordance with at least one embodiment of the illuminant according to the invention the substrate is film-like and can be wound up on a roll and unwound from the roll flexibly, without being damaged in the process. In this case, flexibly means, inter alia, that the substrate is bendable to a certain degree, without the substrate being damaged in the course of bending.

In accordance with one embodiment of the illuminant, in this case the organic layer stacks of the mutually adjacent regions having different emission colors in each case comprise mutually different light-emitting layers which differ with regard to their organic light-emitting material and which are suitable for generating light in different colors. That is to say, for example, that the first region comprises an organic layer stack comprising a first organic light-emitting material. The adjacent region having a different emission color then comprises a second organic light-emitting material, wherein the first organic light-emitting material differs from the second organic light-emitting material. On account of the different organic light-emitting materials, the organic layer stacks of the respective regions are then suitable for generating light of different colors.

Preferably, the optimum values of the layer thicknesses for a respective region for a specific wavelength of the light being emitted can be determined from simulations and/or experiments.

The object is also achieved by means of a coating device for producing such OLE illuminants, comprising a vacuum chamber, a device for linearly transporting a substrate, a plurality of coating sources and diaphragms for limiting the exposed substrate area when the substrate travels past the individual coating regions. Here, a diaphragm is in each case subdivided into a plurality of partial regions which are mutually adjacent in the direction transversely with respect to substrate transport and which have different extents along the substrate transport direction or are in part completely closed. Here, the extents of the respective partial regions are coordinated with one another such that when the substrate travels past the coating sources, on the substrate mutually adjacent regions having optimum layer thicknesses for coupling out light of the respective emission color are produced. This device according to the invention makes it possible to produce, in an efficient manner OLE structures, in particular OLEDs, whose emitted quantities of light for the respective emission color assume the maximum values.

With regard to the present invention, the wording "the substrate travels past the individual coating regions" should be understood to mean a physical transport of the substrate from one coating station to the next in order to apply different layers, wherein the substrate is also transported further during the coating process. The method can be carried out in continuous installations with a continuously transported substrate belt, either a continuous substrate in roll-to-roll coating or a quasi-continuous succession of synchronously moved successive planar package-type substrates.

According to the invention, the diaphragms for limiting the exposed substrate area, when the substrate travels past the individual coating regions, are embodied in a stationary fashion. That makes it possible to carry out coating processes on a continuously moved continuous substrate or a quasi-continuous succession of substrate wafers with the device according to the invention, without stopping the substrate in front of the coating sources or the patterning stations and without concomitantly moving shadow masks. As a result, it is possible to avoid the complex handling of concomitantly moving shadow masks.

According to the invention, a coating region is acted on by means of one of the coating sources in each case. The coating region should be understood to be a region of action of the coating source with material vapor. The coating sources are arranged above the linear guidance of the substrates, which therefore face vertically downward. In this case, the substrate is guided horizontally past the coating sources, such that the coating direction runs vertically.

In principle, other types of spatial relationship between sources and substrates are also possible, for example the arrangement of the sources below the substrate with a vapor direction upward or vertically oriented substrates with horizontal vapor direction.

According to the invention, at least one stationary diaphragm is arranged in between a respective coating source and the substrate guided past.

In accordance with one embodiment of the invention, a partial region is formed as an opening through which the layers on the substrates guided past or moved through are dynamically coated with striped structures.

In accordance with a further embodiment of the invention, a partial region can be produced by a masking above the coating region.

According to the invention, the stepped contour in the extent in the transport direction of the substrates determines the layer thickness of the deposited layers. The longer the extent in the transport direction, the thicker the respective layer. Therefore, in each case different layer thicknesses of the respective deposited layer can be set as a result of the different size of the extent of the respective partial regions.

According to the invention, an evaporator is used as coating source, in particular for organic material. Preferably, a linear evaporator is used for organic material in the evaporation range of 100° C. to 700° C.

The object is also achieved by means of a method for producing such OLED illuminants which comprises the use of the coating device for producing organic light-emitting illuminants and the choice of optimum layer thicknesses.

BRIEF DESCRIPTION OF DRAWING FIGURES

Figure 2:
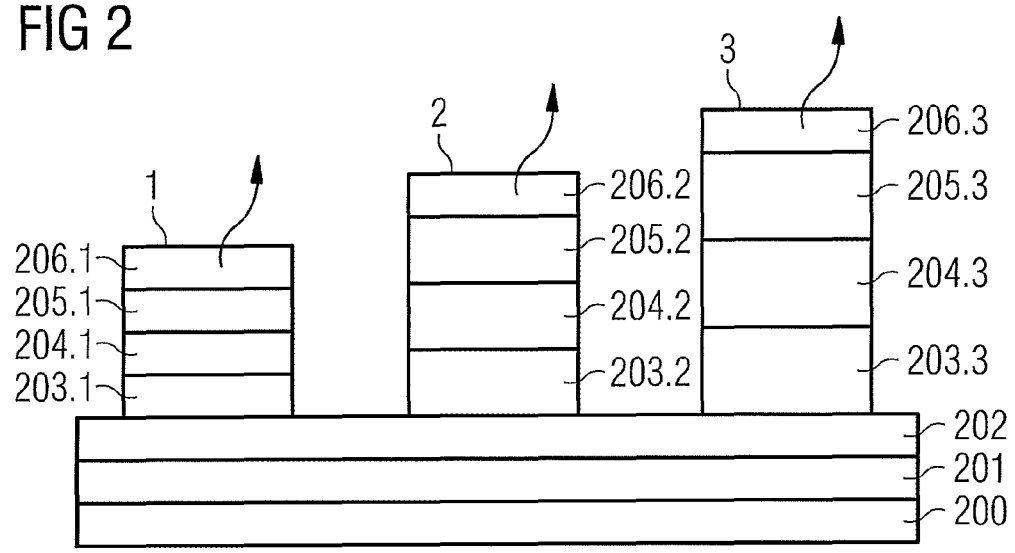

The invention is explained in greater detail below on the basis of preferred exemplary embodiments with reference to drawings, in which:

FIG. 1 shows a schematic construction of an organic light-emitting illuminant according to the prior art, FIG. 2 shows an exemplary embodiment of an organic light-emitting illuminant produced according to the invention in a cross-sectional view, and FIG. 3 shows a schematic construction of the coating device according to the invention.

DETAILED DESCRIPTION

According to FIG. 2, an OLE illuminant produced according to the invention has a substrate 200, on which a smoothing layer 201 and a reflective anode 202 are deposited in succession. Three layer stacks 1, 2 and 3 are arranged in a manner spaced apart alongside one another on the anode layer 202. That is to say that the regions present between and around the respective layer stacks as anode regions are free of the subsequent coating. In principle, the regions of the layer stacks could also directly adjoin one another or merge gradually into one another by means of layer thickness and/or concentration gradients.

Each layer stack 1, 2, 3 has in each case four layers, namely a hole transport layer (HTL) 203.1, 203.2, 203.3, an emission layer (EML) 204.1, 204.2, 204.3, an electron transport layer (ETL) 205.1, 205.2, 205.3 and a cathode layer 206.1, 206.2, 206.3, which is embodied as semitransparent. The emission layer 204.1 of the first layer stack 1 is suitable for generating and emitting the light in a blue color. The emission layer 204.2 of the second layer stack 2 is suitable for generating and emitting the light in a green color. The emission layer 204.3 of the third layer stack 3 is suitable for generating and emitting the light in a red color. Since the OLED illuminant illustrated in FIG. 2 is an OLED illuminant in top emission geometry, the light is emitted in each case via the semitransparent cathode 206.1, 206.2, 206.3, as a result of which three regions having different emission colors are provided.

As can be seen in FIG. 2, the HTL, EML and ETL layers of the respective layer stack have different layer thicknesses in comparison with another layer stack. This is based on the insight that for each emission color there exist optima of the aggregate layer thickness of the HTL, EML and ETL layers, the so-called coupling-out maxima, for which the emitted quantity of light assumes maximum values. In order to obtain a maximum emitted quantity of light for a respective emission color, therefore, the layers HTL, EML and ETL for the respective layer stack, by means of measurements and/or simulations carried out, have layer thicknesses adapted therein. It is thus possible to produce the OLED illuminants whose light coupling-out conditions can be optimally set by the adaptation of the layer thickness of the organic layer, which leads to an efficient emission of the light for the respective color. As a result, the total efficiency of the OLED illuminant can be increased according to the invention.

The coating device 301 according to the invention is an inline vacuum coating installation in which a large-area substrate 300 is moved continuously through the coating or processing stations 302 and a plurality of organic light-emitting illuminants are produced on said substrate. The coating device 301 is used to produce an OLED illuminant having three layer stacks each having a different emission layer, which, as shown in FIG. 3, respectively comprises a blue, a green and a red emission layer. Although FIG. 3 illustrates the diaphragms 303 for producing organic layer stacks having different thicknesses of the organic layers which emit light in three different colors, such as blue, red and green, this coating device 301 according to the invention is not limited only to this example; rather OLED illuminants having more or fewer than three layer stacks or else layer stacks having other emission colors are also conceivable.

According to the invention, the diaphragms 303 illustrated in FIG. 3 are arranged in a stationary fashion between a respective coating source 302 and the substrate guided past. In FIG. 3, there are five processing stations 302.1 to 302.5, each with a stationary diaphragm 303.1 to 303.5. The first diaphragm 303.1 has an opening having a step-like form. It results from a combination of three rectangles A, B, C of different sizes which are combined and arranged centrally with respect to one another. Each rectangle constitutes a partial region according to the invention wherein these partial regions A, B, C have a different extent in the substrate transport direction or are in part completely closed. The different extent corresponds to the respectively different length of the respective rectangle in the transport direction of the substrate. This stepped contour determines in the extent in the transport direction—in association with the steady-state coating rate that is identical for all regions, and the substrate transport speed—the layer thickness of the respective layer stacks. The longer the extent, the thicker the layer applied by vapor deposition becomes.

In the first coating station 302.1 with the diaphragm 303.1, for the respective stack a respective hole transport layer 203.1, 203.2, 203.3 (HTL) is deposited, in particular thermally evaporated. For the first layer stack 1, the layer thickness of the hole transport layer 203.1 is smaller than in the second layer stack 2 and the third layer stack 3. In the second coating station 302.2 with the diaphragm 303.2, an emission layer 204.1 is applied only in the case of the first layer stack 1, said emission layer emitting light in a blue emission color. The length of the extent of the partial region A in the second coating station 302.2 corresponds to the length of the extent of the partial region A in the first coating station 302.1. Consequently, the layer thickness of the hole transport layer 203.1 and of the emission layer 204.1 for the first layer stack 1 is identical. For the second layer stack 2 and the third layer stack 3, the partial region is in each case completely closed, that is to say that in the diaphragm 303.2 there is no opening through which the coating process could take place.

In the third coating station 302.3, the stationary diaphragm 303.3 has only one opening in order to apply the emission layer 204.2 to the second layer stack 2. The extent of the partial region B, that is to say of the opening in the transport direction, corresponds to the layer thickness of the vapor-deposited emission layer 204.2, which is suitable for generating the light in a blue color. For the first layer stack 1 and third layer stack 3, the diaphragm 303.3 has no opening. That is to say that the partial regions A and C for the diaphragm 303.3 are completely closed. In the fourth processing station 302.4, the stationary diaphragm 303.4 has only one opening for the process of coating the emission layer 204.3 onto the third layer stack 3. The extent of the partial region, that is to say of the opening in the transport direction, corresponds to the layer thickness of the vapor-deposited emission layer 204.3, which is suitable for emitting the light in a red color. For the first layer stack 1 and second layer stack 2, the diaphragm 303.4 has no opening. That is to say that the partial regions A and B for the diaphragm 303.4 are completely closed. In the fifth processing station 302.5, the stationary diaphragm 303.5 has a respective partial region for the respective layer stack 1, 2, 3 for the process of coating the electron transport layer 205.1, 205.2, 205.3. The extent of the respective partial region, that is to say of the opening in the transport direction, respectively corresponds to the layer thickness of the respective vapor-deposited electron transport layer 205.1, 205.2, 205.3. In the exemplary embodiment, it is of identical thickness for each organic layer of the respective layer stack 1, 2 and 3. However, the layer thicknesses in the layer stack differ. It is conceivable, however, to vary the layer thickness also within a layer stack with this coating device according to the invention.

The invention claimed is:

1. A coating device for producing an organic light-emitting comprising mutually adjacent regions having in each case different emission colors, wherein each of the regions has the following construction:
    a substrate layer,
    a first electrode layer,
    a first charge carrier transport layer,
    at least one emission layer,
    a second charge carrier transport layer, and
    a second electrode layer,
    wherein thicknesses of the first charge carrier transport layer, the at least one emission layer and/or the second charge carrier transport layer differ in the mutually adjacent regions and are set in each case such that an optimum coupling-out for the light color emitted in the corresponding region can be achieved in each case,
    comprising: a vacuum chamber, a device for linearly transporting a substrate, a plurality of coating sources and diaphragms for limiting an exposed substrate area when the substrate travels past the coating sources, wherein a diaphragm is in each case subdivided into a plurality of partial regions which are mutually adjacent in a direction transverse with respect to a substrate transport direction and which have different extents along the substrate transport direction, and an extent of the partial regions is coordinated with one another such that when the substrate travels past the coating sources, on the substrate, the mutually adjacent regions having optimum layer thicknesses for coupling out light of the respective emission color are produced.

2. The coating device as claimed in claim 1, wherein the diaphragms are embodied in a stationary fashion between a respective coating source and the substrate guided past the respective coating source.

3. The coating device as claimed in claim 2, further comprising means for horizontal linear guidance of the substrate at the coating sources, such that a coating direction is vertical.

4. The coating device as claimed in claim 2, wherein in each case different layer thicknesses of respective deposited layers can be set as a result of different size of the extent of the respective partial regions.

* * * * *

UNITED STATES PATENT AND TRADEMARK OFFICE
CERTIFICATE OF CORRECTION

| | | |
|---|---|---|
| PATENT NO. | : 8,716,726 B2 | Page 1 of 1 |
| APPLICATION NO. | : 13/992370 | |
| DATED | : May 6, 2014 | |
| INVENTOR(S) | : Deus et al. | |

It is certified that error appears in the above-identified patent and that said Letters Patent is hereby corrected as shown below:

In the Claims

Column 8, Line 46: Claim 4, Delete "claim 2" and insert -- claim 1 --

Signed and Sealed this
Twenty-second Day of July, 2014

Michelle K. Lee
*Deputy Director of the United States Patent and Trademark Office*